United States Patent [19]

Yoon

[11] Patent Number: 5,628,060
[45] Date of Patent: May 6, 1997

[54] APPARATUS AND METHOD FOR SELECTING STATION USING D/A CONVERTER TO CONTROL THE LOCAL OSCILLATOR

[75] Inventor: Sang H. Yoon, Taegu, Rep. of Korea

[73] Assignee: Goldstar Co., Ltd., Seoul, Rep. of Korea

[21] Appl. No.: 310,059

[22] Filed: Sep. 21, 1994

[30] Foreign Application Priority Data

Sep. 21, 1993 [KR] Rep. of Korea ............... 1993-19161

[51] Int. Cl.$^6$ ............................................. H04B 1/18
[52] U.S. Cl. ................... 455/183.2; 455/192.2; 455/184.1; 455/260; 455/264
[58] Field of Search ............... 455/185.1, 186.1, 455/192.2, 184.1, 181.1, 182.1, 182.2, 183.1, 2, 197.1, 182.3, 256, 260, 264, 318

[56] References Cited

U.S. PATENT DOCUMENTS

| | | | |
|---|---|---|---|
| 4,352,205 | 9/1982 | Kato et al. | 455/185.1 X |
| 4,422,096 | 12/1983 | Henderson | 455/185.1 X |
| 4,479,248 | 10/1984 | Caspari et al. | 455/183.2 |
| 5,107,522 | 4/1992 | Kitayama et al. | 455/256 X |

Primary Examiner—Reinhard J. Eisenzopf
Assistant Examiner—Philip J. Sobutka

[57] ABSTRACT

An apparatus and a method for selecting a station are disclosed in which a count section or a comparison section compares/decides a local oscillation frequency, and a digital/analog converter controls the local oscillation frequency according to the decided result, in order to perform an accurate and stable station selection. The apparatus includes a local oscillator means, a dividing means, a count section or comparison section, a control section, and a digital analog converter. The method includes the steps of controlling the digital/analog converter, dividing, the signal output from the local oscillator outputting correction data, and controlling increase/decrease of the oscillation frequency of the local oscillator according to the correction data.

24 Claims, 5 Drawing Sheets

1

APPARATUS AND METHOD FOR SELECTING STATION USING D/A CONVERTER TO CONTROL THE LOCAL OSCILLATOR

BACKGROUND OF THE INVENTION

The present invention relates to an apparatus and a method for selecting station, and more particularly to an apparatus and a method for selecting station in which a count section or comparison section compares/decides a local oscillation frequency, and then a digital analog converter controls the local oscillation frequency according to the decided result, in order to perform an accurate and stable station selection.

In a conventional superheterodyne receiver, AFS type or VS type apparatus for selecting station is applied widely. In the case of a VS type, a desired broadcast channel is selected by controlling a local oscillator through a DC voltage, but the channel selection is difficult because of control voltage deviations of the local oscillator and control voltage deviations due to deviations between parts. Also, in the case of a F type, since a PAL circuit controls the oscillation frequency of the local oscillator, the oscillation stability of the local oscillator is decreased.

FIG. 1 shows a conventional F type apparatus for selecting station which includes an antenna 1, a preamplifier 2, a mixer 3, a filter 4, an IF amplifier 5, a local oscillator 6, a divider 7, a PAL circuit 8, a reference oscillator 9, an integrator 10, a CPU 11, and an AFT detector 12, and the operation thereof is described below.

A RF signal received through the antenna 1 is supplied, after being amplified in the preamplifier 2, to the mixer 3 which mixes the local oscillator signal supplied from the local oscillator 6 and the signal amplified from the preamplifier 2 and then outputs an IF signal. The IF signal is filtered through the filter 4, is amplified in the IF amplifier 5, and then is applied to the AFT (automatic fine tuning) detector 12. The AFT detector 12 detects an AFT detector signal and supplies it to the CPU 11.

The CPU 11 supplies data corresponding to a desired local oscillation frequency to the PAL circuit 8 by inputting the AFT detector signal and a user's selection command to control the local oscillation frequency of the local oscillator 6 to the desired channel. The PAL circuit 8 divides the output of the divider 7 again through this data, and performs phase comparison with the reference frequency signal of the reference frequency oscillator 9.

The PAL circuit 8 performs phase comparison of above-mentioned two signals and then generates a pulse signal in order to charge/discharge a voltage for controlling the local oscillator 6. The pulse signal, after being integrated in the integrator 10, controls the local oscillator 6 thereby generating the local oscillator signal for the desired channel selection. While the local oscillator signal is supplied to the mixer 3 which generates an IF signal of the desired channel, it is also supplied to the divider 7, after being divided by a predetermined division ratio, and is fed to the PAL circuit 8 again.

In such a F type apparatus for selecting station, since the PAL circuit 8 controls the local oscillator 6, a fine pulse element (it is not a control pulse but an element generated according to an oscillator signal change) is generated in the output of the PAL circuit 8. For this reason, noise increases and local oscillation frequency stability decreases. In addition, because the CPU 11 can not control a control voltage change finely, channel selection stability and selectivity decrease.

SUMMARY OF THE INVENTION

It is an object of the present invention to provide an apparatus and a method for selecting a station in which a control section decides a local oscillation frequency and a digital/analog converter controls the oscillation of local oscillator means by using the decided result, so as to increase the stability of the local oscillation frequency.

An apparatus for selecting a station according to a first embodiment of the present invention having a preamplifier for amplifying a RF signal received through an antenna, a mixer for mixing the signal amplified from the preamplifier and a local oscillator signal, a filter for filtering the signal outputted from the mixer, and an IF amplifier for amplifying the signal supplied from the filter, comprises local oscillator means for supplying the local oscillator signal to the mixer, means for dividing the local oscillator signal, means for counting the signal outputted from the dividing means, control means for converting the output value received from the counting means into a frequency and outputting correction data based on the frequency value, and digital/analog conversion means for converting the digital data supplied from the control means into an oscillation control voltage for the local oscillator means and supplying it to the local oscillator means.

An apparatus for selecting a station according to a second embodiment of the present invention having a preamplifier for amplifying a RF signal received through an antenna, a mixer for mixing the signal amplified from the preamplifier and a local oscillator signal, a filter for filtering the signal outputted from the mixer, and an IF amplifier for amplifying the signal supplied from the filter, comprises local oscillator means for supplying the local oscillator signal to the mixer, means for dividing the local oscillator signal, means for comparing the signal outputted from the dividing means with reference data for controlling channel selection, control means for supplying reference data for channel selection to the comparing means and outputting correction data by inputting the comparison result outputted from the comparing means, and digital analog conversion means for converting the digital data supplied from the control means into an oscillation control voltage for the local oscillator means and supplying it to the local oscillator means.

A method for selecting a station according to a first embodiment of the present invention includes the steps of initiating the control of digital/analog conversion means in order for local oscillator means to carry out an oscillation operation near a selected channel when a channel selection command is received by control means, dividing the outputted frequency oscillated from the local oscillator means, counting the divided frequency value during a predetermined period of time, converting the counted value into frequency, outputting correction data of the difference to the digital analog conversion means, and controlling increase/decrease of the oscillation frequency of the local oscillator means by converting the output data into an analog signal.

A method for selecting a station according to a second embodiment of the present invention includes the steps of initiating the control of digital/analog conversion means in order for local oscillator means to carry out an oscillation operation near a selected channel when a channel selection command is received by control means, dividing the outputted frequency oscillated from the local oscillator means, comparing the divided frequency value with a reference frequency value of the selected channel and sending that data for correcting the difference between the local oscillation frequency and the reference frequency of the selected channel to the digital/analog conversion means, and controlling increase/decrease of the oscillation frequency of the local oscillator means by converting the output data into an analog signal.

These and other objects of the present application will become more readily apparent from the detailed description given hereinafter. However, it should be understood that the preferred embodiments of the invention are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE PREFERRED EMBODIMENTS

Figure 1:
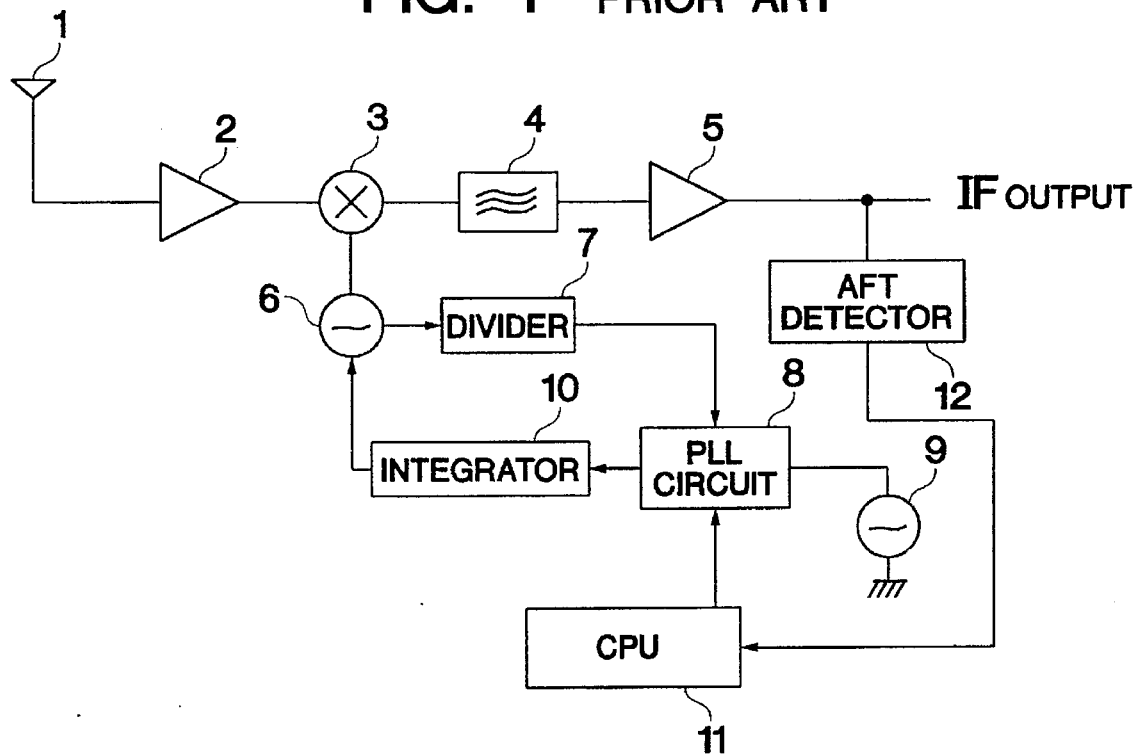
FIG. 1 is a block diagram of a conventional F type apparatus for selecting station.
Figure 2:
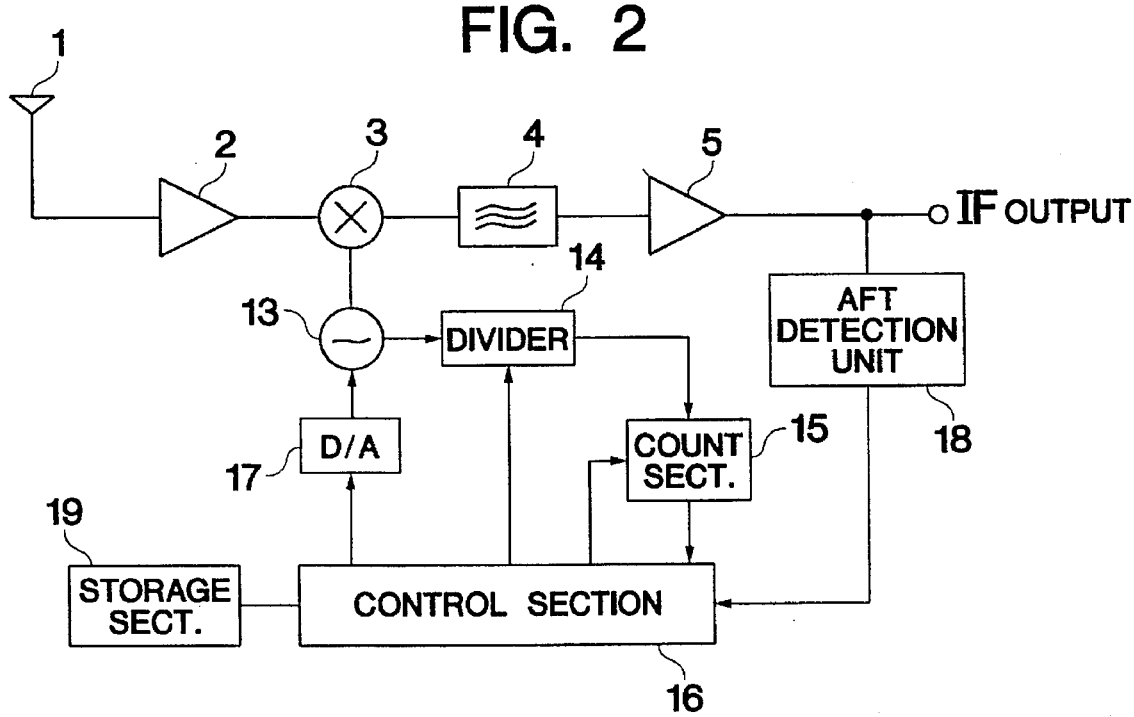
FIG. 2 is a block diagram of an apparatus for selecting a station according to a first embodiment of the present invention.

FIG. 2 shows an apparatus for digital station selection according to a first embodiment of the present invention.

Referring to FIG. 2, the apparatus for digital station selection according to the first embodiment of the present invention comprises a preamplifier 2 for amplifying a RF signal received through an antenna 1, a mixer 3 for mixing the signal amplified from the preamplifier 2 and a local oscillation signal, a filter 4 for filtering the signal outputted from the mixer 3, an IF amplifier 5 for amplifying the signal supplied from the filter 4, a local oscillation circuit 13 for supplying the local oscillation signal to the mixer 3, a divider 14 for dividing the signal oscillated from the local oscillation circuit 13, a count section 15 for counting the signal outputted from the divider 14, a control section 16 for converting the output value received from the count section 15 into a frequency and outputting correction data based on the frequency value, digital/analog converter 17 for converting the digital data supplied from the control section 16 into an oscillation control voltage for the local oscillation circuit 13 and supplying it to the local oscillation circuit 13, and an AFT detection unit 18 for detecting an AFT detection signal through the signal outputted from the IF amplifier 5 and supplying it to the control section 16.

In addition, the apparatus for digital station selection according to the first embodiment of the present invention further comprises a storage section 19 for storing the local oscillation frequency data of a selected channel and supplying the selected channel data to the control section 16.

Figure 7:
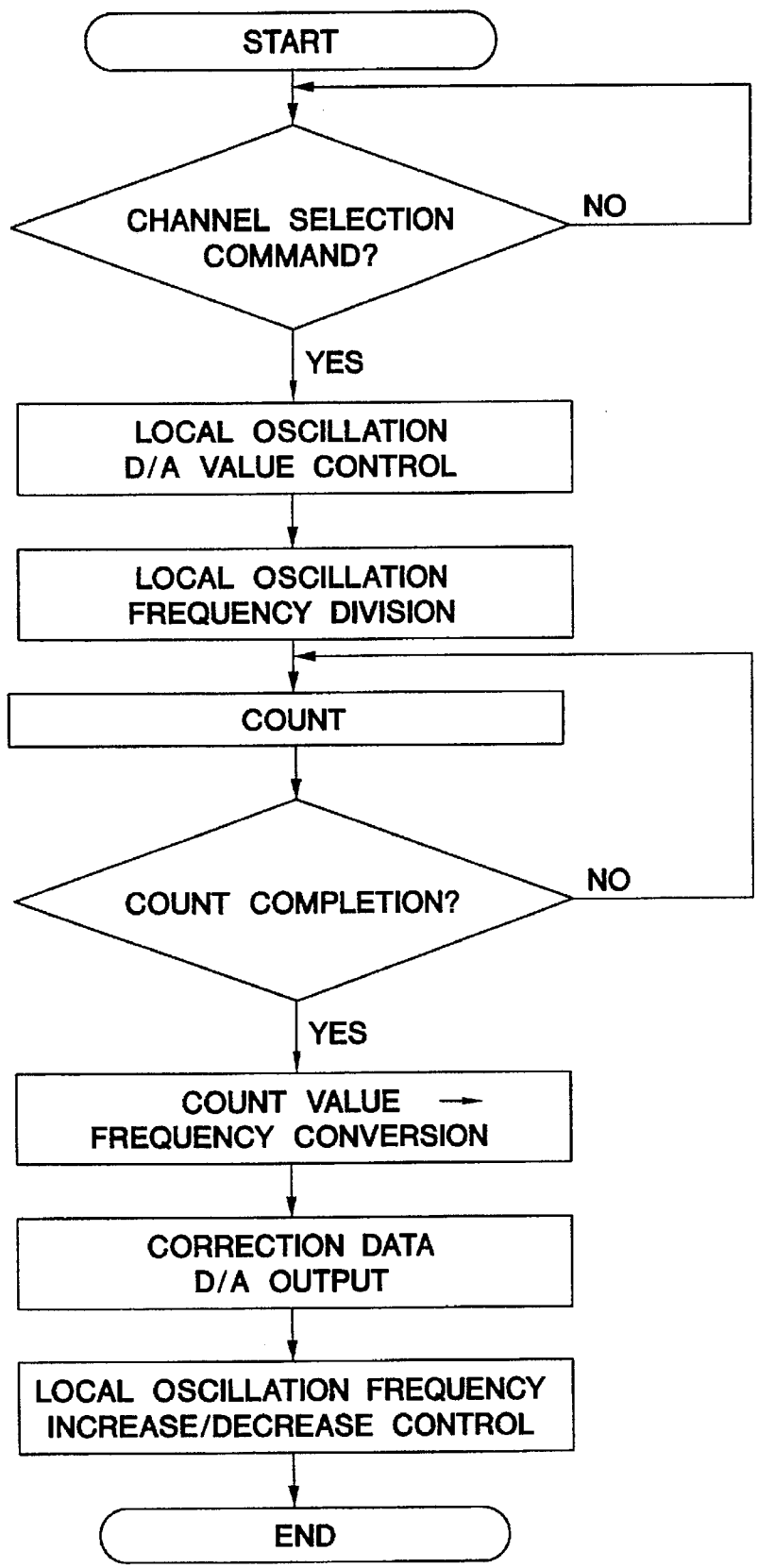
FIG. 7 is a flow chart for explaining an operation for selecting a station according to the first embodiment of the present invention.

The operation of the apparatus for digital station selection according to the first embodiment of the present invention will now be described (FIG. 7).

A RF signal received through the antenna 1 is inputted, after being amplified in the preamplifier 2, to the mixer 3, which mixes the amplified RF signal and the local oscillation signal of the local oscillation circuit 13 and outputs an IF signal.

The filter 4 passes only the IF signal therethrough. The passed IF signal is inputted, after being amplified in the IF amplifier 5, to the AFT detection unit 18. The AFT detection unit 18 generates a DC voltage proportional to a frequency deviation amount and feeds it back to the control section 16.

When a channel selection command for selecting a desired channel is inputted, the control section 16 outputs selection control data corresponding to a voltage controlling the local oscillation circuit 13 which is required for selecting a specific channel to the digital/analog converter 17, which outputs the voltage for controlling the local oscillation circuit 13.

The frequency of the local oscillation signal of the local oscillation circuit 13 is changed by the control voltage. While the changed local oscillation signal is supplied to the mixer 3 and then goes through the above-mentioned signal processing steps, it is also inputted to the divider 14 which executes a frequency division of the inputted local oscillation signal and supplies the result to the count section 15.

The division operation of the divider 14 is performed under the control of the control section 16. In addition, the count section 15 counts the output signal of the divider 14 under the control of the control section 16 and supplies the result to the control section 16.

The control section 16 judges the number of pulses inputted from the count section 15 during a predetermined period, converts the judged value into a frequency, supplies correction data to the digital/analog converter 17 according to the converted frequency, and controls the oscillation frequency of the local oscillation circuit 13.

The resolution of the digital/analog converter 17 is determined to satisfy the following equation, approximately.

$$2^x > (fmax - fmin)/fres$$

where the range from from (minimum frequency) to fmax (maximum frequency) represents the control range of the local oscillation frequency, fres represents the number of the control steps, and x represents the bit number of the digital/analog converter 17.

The output voltage of the digital/analog converter 17 increases linearly according to the inputted data. However, since the control voltage and frequency of the local oscillation circuit 13 do not satisfy a primary function, the digital/analog converter 17 requires an extra bit number which can be established experimentally.

Furthermore, the bit number of the digital/analog converter 17 can be changed according to what percent of the output voltage of the digital/analog converter 17 is used as the control voltage of the local oscillation circuit 13.

Besides, it is preferable that the divider 14 divides the frequency so that the division amount exists within the frequency band in which the following count section 15 can operate in consideration of the fmax.

That is, the relation is expressed by the following equation:

maximum operation frequency of the count section 15 ≧(fmax/division ratio). On the other hand, the bit number y of the count section 15 is preferably determined to satisfy the following equation:

$$2^y \geq (fmax-fmin)/fres.$$

A minimum value Tmin of a time during which the control section 16 reads the output value of the count section 15 is indicated by the following equation:

$$Tmin = \{division\ ratio/fmax\} \times \{(fmax-fmin)/fres\}$$

As known from the above-mentioned equations, since Tmin is proportional to the division ratio, Tmin is increased according to the increment of the division ratio.

Therefore, a time Ttotal during which the control section 16 controls such a loop once is expressed by the following equation:

Ttotal = Tmin +
    read time for the output data from the count section 15 +
    operation time of the control section 16 +
    response time of the digital analog converter 17 +
    response time of the local oscillator.

The Ttotal can be reduced by decreasing the Tmin, and the Tmin can be further reduced by changing the division ratio according to the frequency of the local oscillator circuit 13.

In addition, it is possible that the control section 16 increases the fres in a transient state, decreases the fres as the frequency of the local oscillation circuit 13 approaches the desired frequency, and finally controls the Tmin so as to correspond to the desired fres.

Figures 3, 4:
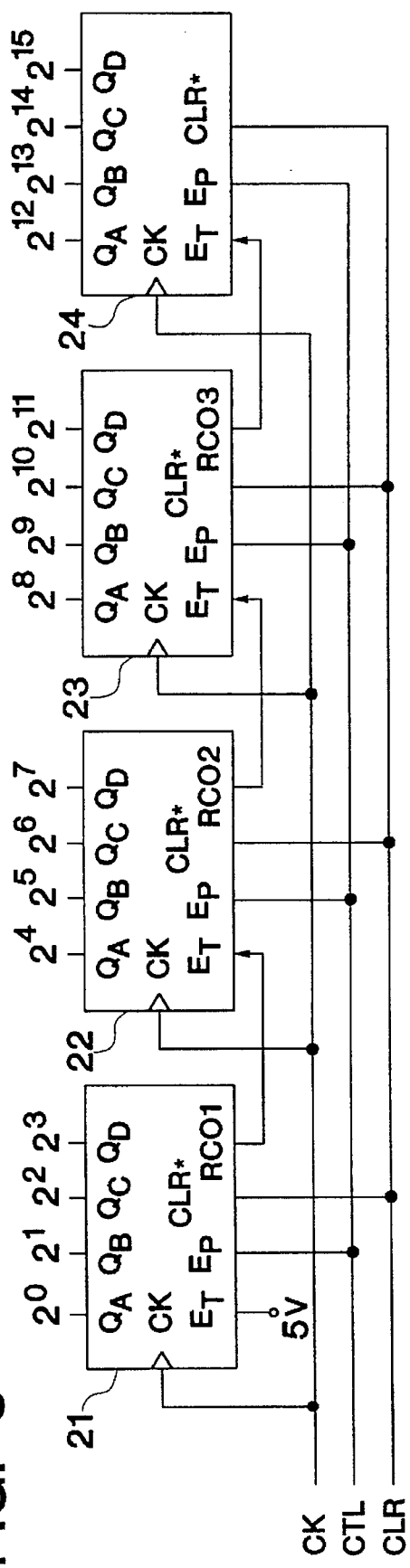
FIG. 3 is a circuit diagram of a count section in FIG. 2.
FIG. 4 is a function table illustrating the operation relation of the count section according to the present invention.
Figure 5:
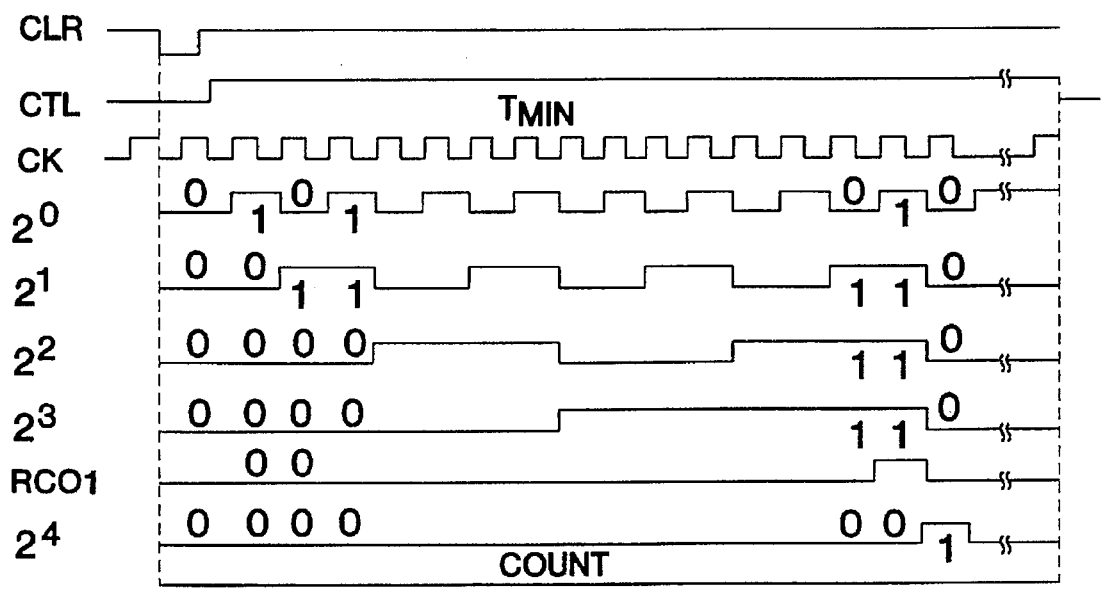
FIG. 5 is a time chart illustrating the operation of the count section according to the present invention.

FIG. 3 shows the count section 15 of the present invention which is constituted by a 74 LS161 (standard TTL IC), and FIG. 4 and FIG. 5 show a function table and a time chart of respective counters 21, 22, 23, and 24, respectively.

In such a circuit, the output pulse of the divider 14 is inputted to a counter clock terminal CK, and a control signal CTL and a clear signal CLR are supplied from the control section 16.

If the clear signal CLR outputted from the control section 16 becomes L (low) in order to read out the pulse frequency supplied to the counters 21, 22, 23, and 24, all the outputs $Q_A$, $Q_B$, $Q_C$, and $Q_D$ of the counters 21, 22, 23, and 24 become L. Subsequently, when the outputted control signal CTL is H (high), the outputs of the counters 21, 22, 23, and 24 increase by 1 at a positive edge of the pulse inputted to the clock terminal CK by means of the function table of FIG. 4, as shown in FIG. 5. Whenever all the output values become H, the carry output terminals RCO1, RCO2, and RCO3 become H, so that the counter output increased by the input pulse performs $2^{16}$ counts through an input $F_T$ to the following counter.

In this case, the time control of the Tmin can be accomplished by the control signal CTL. If the control signal CTL is L, the data of the respective outputs $Q_A$, $Q_B$, $Q_C$, and $Q_D$ can be converted into frequency by reading the data of the respective outputs $Q_A$, $Q_B$, $Q_C$, and $Q_D$.

For example, when the control frequency of the local oscillation circuit 13 has the following conditions of fmin= 10 MHz, fmax=100 MHz, fres=10 KHz, and division ratio= 10, the resolution of the digital/analog converter 17 is indicated below:

$$(fmax-fmin)/fres=(100\ MHz-10\ MHz)/10\ KHz=9000.$$

Accordingly, if 14 bits are used, the resolution is $2^{14}$= 16384, thereby satisfying the above-mentioned fres.

Like the resolution of the digital/analog converter 17, the resolution of the count section 15 satisfies the following equation:

$$2^{14} < (100\ MHz-10\ MHz)/10\ KHz,$$

and in this case, $$Tmin \simeq 10/100MHz \times (100MHz - 10MHz)/10KHz$$
$$\simeq 900 \times 10^{-6}\ sec.$$

That is, if the control section 16 clears the count section 15, and makes the control signal CTL high (H), and the read output value of the counters 21, 22, 23, and 24 after $900 \times 10^{-6}$ sec is 9000, the local oscillation frequency oscillates at 100 MHz.

In the transient state during the selection operation, a fast loop time constant is required. For example, when the Tmin becomes $450 \times 10^{-6}$ sec, the fres is increased to 20 KHz and the loop time constant becomes fast. Approaching to the oscillation frequency of the local oscillation circuit 13 required for the selection, the Tmin is increased to $900 \times 10^{-6}$ sec.

When the control section 16 has a sufficient operation time, the bit number of the count section 15 is reduced and the carry and data of the counters are read out, thereby counting the number of (fmax-fmin)/fres during the total Tmin time. On the other hand, when a system requires a very fast loop time constant, the storage section 19 is provided, and the control section 16 stores the center frequency of the oscillation frequency of the local oscillation circuit 13 for the respective channels by controlling the digital/analog converter 17, resulting in the very fast loop time constant.

Namely, when a channel selection command is inputted, the control section 16 reads out the center frequency data of the selected channel corresponding to the command from the storage section 19, supplies the data to the digital/analog converter 17, and makes the local oscillation circuit 13 oscillate at the local oscillation frequency of the channel, so that a desired channel is selected at a high speed and the local oscillation frequency of the selected channel is stabilized by the above-mentioned loop control operation.

In addition, by establishing a prescribed reference channel, it is possible for the storage section 19 to store only the difference of the reference channel and the remaining channels, instead of storing the data of the respective channels as many as the bit number of the digital analog converter 17. Therefore, the control section 16 reads out the difference and converts it into the local oscillation frequency data of the corresponding channel, thereby reducing the capacity of the storage section 19.

Figure 6:
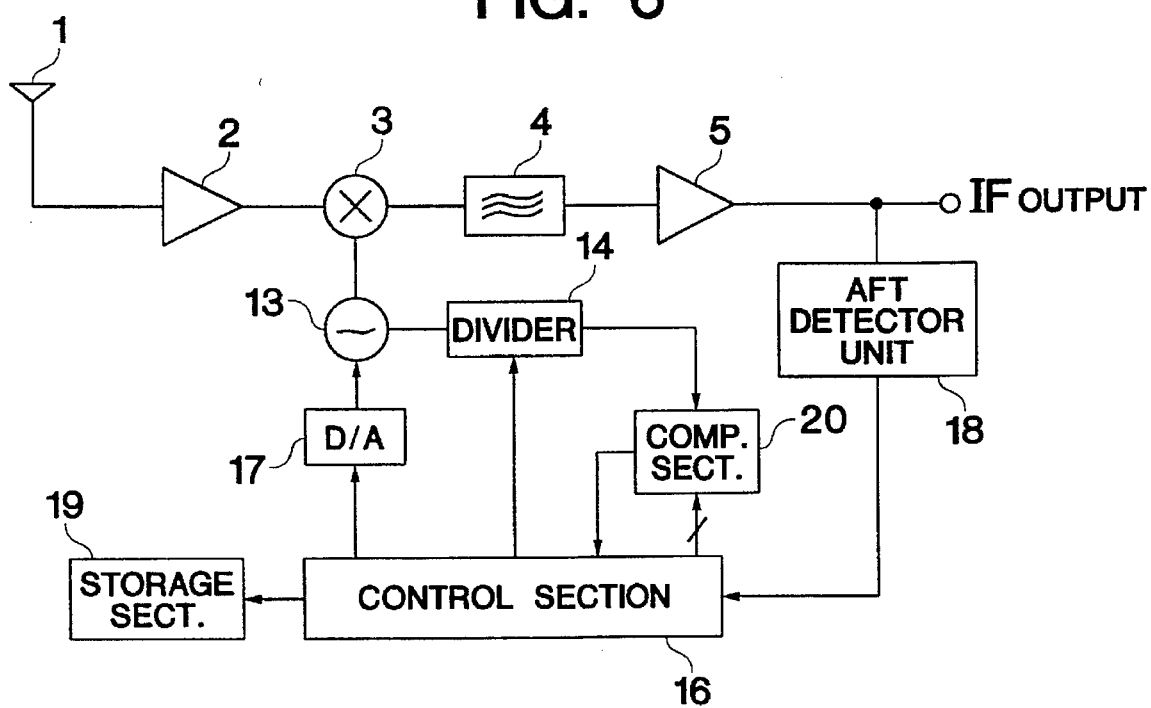
FIG. 6 is a block diagram of an apparatus for selecting a station according to a second embodiment of the present invention.

FIG. 6 shows the apparatus for selecting a station according to a second embodiment of the present invention.

The first embodiment of FIG. 2 is different from the second embodiment of FIG. 6 which includes a comparison section 20 for comparing the signal outputted from the divider 14 with reference data for channel selection supplied from the control section 16 and supplying the result to the control section 16, and a control section 16 for supplying the reference data for channel selection to the comparison section 20 and outputting correction data by inputting the comparison result outputted from the comparison section 20. In FIG. 6, parts and elements corresponding to those of FIG. 2 are identified with the same reference numerals and a detailed description thereof is omitted.

Figure 8:
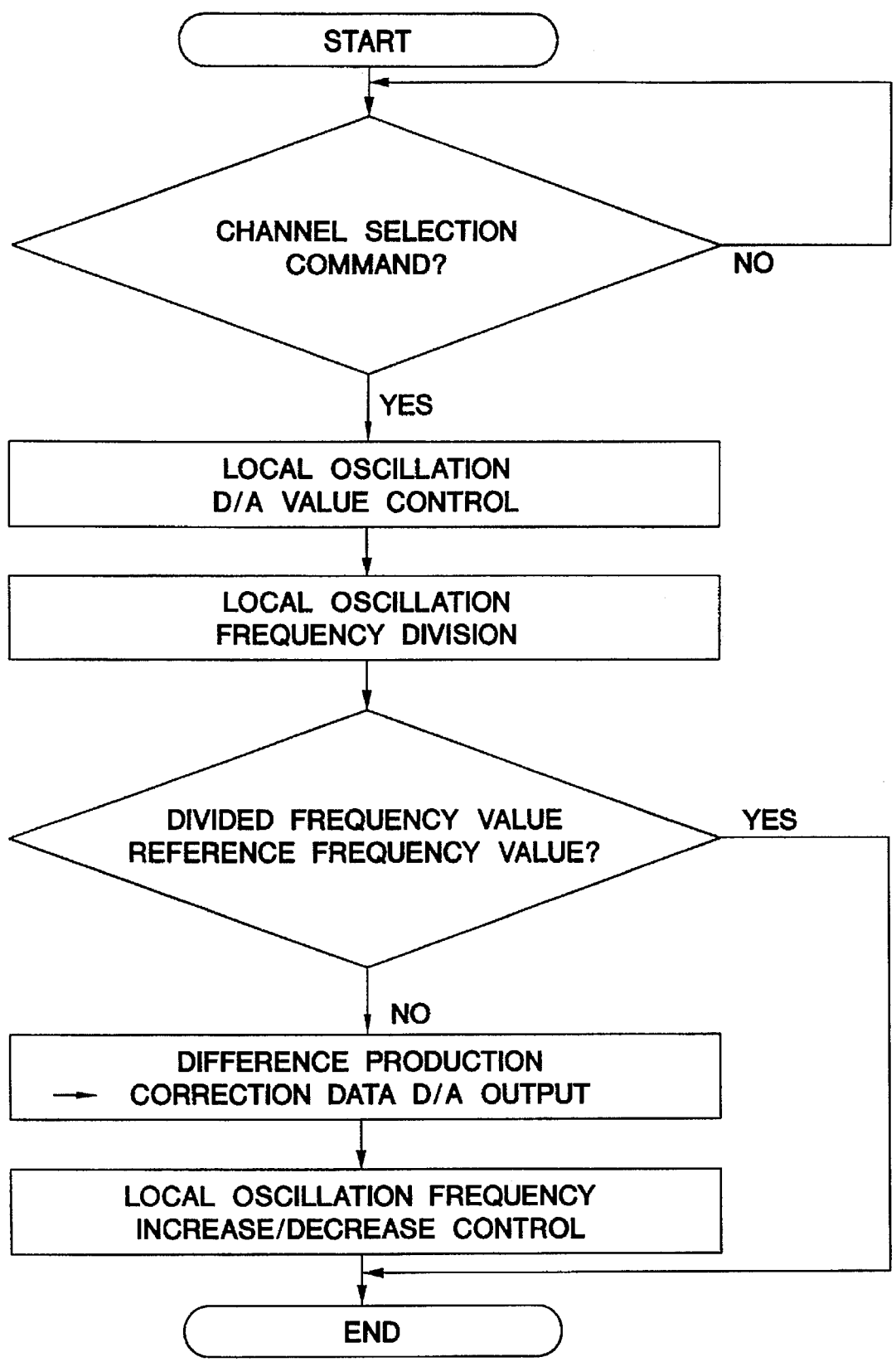
FIG. 8 is a flow chart for explaining an operation for selecting a station according to the second embodiment of the present invention.

The operation of the apparatus for selecting a station according to the second embodiment of the present invention will now be described (FIG. 8).

In FIG. 6, the control section 16 supplies data corresponding to the center frequency of the channel to the comparison section 20 as comparison reference data, the comparison section 20 compares the frequency division value inputted from the divider 14 with the above-mentioned reference data and supplies the difference value to the control section 16, and the control section 16 receives the difference value data and supplies data for correcting the error to the digital/analog converter 17, so that the oscillation frequency of the local oscillation circuit 13 is stabilized as described above.

In this case, the stabilization control of the oscillation frequency of the local oscillation circuit 13 can be accomplished at a high speed by using the storage section 19 like the first embodiment.

In the case of the second embodiment, the bit number of the comparison section 20 is determined so as to be equal to that of the count section 15 of the first embodiment.

In the case of applying the example of the channel selection operation of the first embodiment as it is, that is, when the local oscillation circuit 13 is oscillated at the 100 MHz, the comparison section 20 is supplied with 9000 as the reference data, and the output of the comparison section 20 is decided after the Tmin. When the decided result is "the input pulse number of the comparison section 20>9000", the oscillation frequency of the local oscillation circuit 13 is decreased by controlling the output voltage of the digital/analog converter 17. On the other hand, when "the input pulse number of the comparison section 20<9000", the oscillation frequency of the local oscillation circuit 13 is increased in the same manner.

Thus, the total oscillation frequency is stabilized to the selected channel frequency.

The channel selection operation is performed so as to be "the input pulse number of the comparison section 20=9000 (the center frequency data of the channel)".

After the data of the comparison section 20 and the Tmin time are reduced simultaneously during the transient period, the loop time constant becomes fast by lengthening the Tmin time as approaching the local oscillation frequency.

For example, if the comparison section 20 is supplied with 4500 and the Tmin becomes $450 \times 10^{-6}$ see, the loop time constant can be reduced.

Also, in the case of both the first embodiment and the second embodiment, a deviation of a carrier frequency inputted to the antenna 1 or a temperature drift of the local oscillation circuit 13 is controlled by an AFT voltage.

As described above, since the desired channel selection is executed accurately and stably by the present invention, the performance of a tuner is improved, the channel selection is easy, and the stability of the local oscillation frequency is increased.

While specific embodiments of the invention have been illustrated and described wherein, it is to realize that modifications and changes will occur to those skilled in the art. It is therefore to be understood that the appended claims are intended to cover all modifications and changes as fall within the true spirit and scope of the invention.

What is claimed is:

1. A method for selecting a station, comprising the steps of:

initiating a control of digital/analog conversion means to carry out an oscillation operation near a selected channel when a channel selection command is received by control means and generating an oscillator signal according to the channel selection command, said initiating step including determining a resolution of the digital/analog conversion means to satisfy the following condition:

$$2^x = (fmax - fmin)/fres,$$

where (fmax−fmin) represents a control range of a local oscillation frequency, fres represents a number of control steps, and x represents a bit number of the digital/analog conversion means;

dividing the oscillator signal generated from said initiating step;

counting the divided oscillator signal during a predetermined period, converting the count value into a frequency value, and outputting correction data based on the count value to said digital/analog conversion means; and controlling increase/decrease of an oscillation frequency of local oscillator means based on an output of said digital/analog conversion means.

2. A method according to claim 1, wherein a division ratio of said dividing step is controlled so that the oscillation frequency approaches the local oscillation frequency of said selected channel.

3. A method according to claim 1, wherein a time for reading out said count value is changed so that the oscillation frequency approaches the local oscillation frequency of said selected channel.

4. A method according to claim 1, wherein said counting step uses a count section which satisfies the following condition:

$$\text{maximum operation frequency of the count section} \geq (fmax/\text{division ratio}),$$

wherein fmax represents a maximum local oscillation frequency and the division ratio represents a division ratio used in said dividing step.

5. A method according to claim 1, wherein said counting step uses a counter which satisfies the following condition:

$$2^y \geq (fmax \text{ and } fmin)/fres,$$

wherein (fmax−fmin) represents a control range of a local oscillation frequency, fres represents a number of control steps for the digital/analog conversion means, and Y represents a bit number of the counter.

6. A method according to claim 1, wherein said converting step includes reading the count value from a counter so as to satisfy the following condition:

$$Tmin = [\text{division ration}/fmax] \times [(fmax - fmin)/fres],$$

wherein Tmin represents a minimum time value for reading the count value, the division ratio represents a division ratio used in said dividing step, fmax represents a maximum local oscillation frequency, fmin represents a minimum local oscillation frequency, and fres represents a number of control steps used in said digital/analog conversion means.

7. A method for selecting a station, comprising the steps of:

initiating a control of digital/analog conversion means to carry out an oscillation operation near a selected channel when a channel selection command is received by control means and generating an oscillator signal according to the channel selection command, said initiating step including determining a resolution of the digital/analog conversion means to satisfy the following condition:

$$2^x = (fmax - fmin)/fres,$$

where (fmax−fmin) represents a control range of a local oscillation frequency, fres represents a number of control steps, and x represents a bit number of the digital/analog conversion means;

dividing the oscillator signal from said initiating step;

comparing the divided oscillator signal with a reference frequency signal of said selected channel; and controlling increase/decrease of an oscillation frequency of local oscillator means based on the comparison result.

8. A method according to claim 7, wherein a division ratio of said dividing step is controlled so that the oscillation frequency approaches the local oscillation frequency of said selected channel.

9. A method according to claim 7, wherein said reference frequency signal of said selected channel is changed so that the oscillation signal approaches the local oscillation frequency of said selected channel.

10. A method according to claim 7, wherein said counting step uses a count section which satisfies the following condition:

$$\text{maximum operation frequency of the count section} \geq (fmax/\text{division ratio}),$$

wherein fmax represents a maximum local oscillation frequency and the division ratio represents a division ratio used in said dividing step.

11. A method according to claim 7, wherein said counting step uses a counter which satisfies the following condition:

$$2^Y \geq (fmax \text{ and } fmin)/fres,$$

wherein (fmax−fmin) represents a control range of a local oscillation frequency, fres represents a number of control steps for the digital/analog conversion means, and Y represents a bit number of the counter.

12. A method according to claim 7, wherein said converting step includes reading the count value from a counter so as to satisfy the following condition:

$$Tmin = [\text{division ration}/fmax] \times [(fmax - fmin)/fres],$$

wherein Tmin represents a minimum time value for reading the count value, the division ratio represents a division ratio used in said dividing step, fmax represents a maximum local oscillation frequency, fmin represents a minimum local oscillation frequency, and fres represents a number of control steps used in said digital/analog conversion means.

13. An apparatus for selecting a station, having a preamplifier for amplifying a RF signal received through an antenna, a mixer for mixing the signal amplified from the preamplifier and a local oscillator signal, a filter for filtering the signal outputted from the mixer, and an IF amplifier for amplifying the signal supplied from the filter, the apparatus comprising:

local oscillator means for supplying the local oscillator signal to said mixer;

dividing means for dividing said local oscillator signal;

counting means for counting the divided signal outputted from said dividing means;

control means for converting an output value received from said counting means into a frequency value and outputting correction data based on the frequency value; and digital/analog conversion means for converting digital data supplied from said control means into an oscillation control voltage and supplying the oscillation control voltage to said local oscillator means, a resolution of said digital/analog conversion means being determined to satisfy the following condition:

$$2^x < (fmax - fmin)/fres,$$

wherein (fmax−fmin) represents a control range of a local oscillation frequency for said local oscillator means, fres represents a number of control steps, and x represents a bit number of said digital/analog conversion means.

14. An apparatus according to claim 13, further comprising:

means for storing center frequency data of respective channels to be selected and supplying the stored data to said control means.

15. An apparatus according to claim 13, further comprising:

means for storing frequency data of a reference channel among channels to be selected and the frequency difference of the reference channel and the remaining channels, and supplying the stored data to said control means.

16. An apparatus according to claim 13, wherein said counting means satisfies the following condition:

$$\text{a maximum operation frequency of said counting means} \geq (fmax/\text{division ration}).$$

17. An apparatus according to claim 13, wherein said counting means satisfies the following condition:

$$2^Y \geq (fmax - fmin)/fres,$$

wherein (fmax−fmin) represents a control range of a local oscillation frequency, fres represents a member of control steps for said digital/analog conversion means, and Y represents a bit number of said counting means.

18. An apparatus according to claim 13, wherein said apparatus satisfies the following condition:

$$Tmin = [\text{division ratio}/fmax] \times [(fmax - fmin)/fres],$$

wherein Tmin represents a minimum time value during which said control means reads the output value from said counting means, the division ratio representing a division ratio used in said dividing means, fmax and fmin represents maximum and minimum local oscillation frequencies, respectively, and fres represents a number of control steps used in said digital/analog conversion means.

19. An apparatus for selecting a station, having a preamplifier for amplifying a RF signal received through an antenna, a mixer for mixing the signal amplified from the preamplifier and a local oscillator signal, a filter for filtering the signal outputted from the mixer, and an IF amplifier for amplifying the signal supplied from the filter, the apparatus comprising:

local oscillator means for supplying the local oscillator signal to said mixer;

dividing means for dividing said local oscillator signal;

comparing means for comparing the divided signal outputted from said divding means with reference data for controlling channel selection;

control means for supplying the reference data for channel selection to said comparing means and outputting correction data based on the comparison result outputted from said comparing means; and digital/analog conversion means for converting digital data supplied from said control means into an oscillation control voltage and supplying the oscillation control voltage to said local oscillator means, a resolution of said digital/analog conversion means being determined to satisfy the following condition:

$$2^x > (fmax-fmin)/fres,$$

wherein (fmax–fmin) represents a control range of a local oscillation frequency for said local oscillator means, fres represents a number of control steps, and x represents a bit number of said digital/analog conversion means.

20. An apparatus according to claim 19, further comprising:

means for storing center frequency data of respective channels to be selected and supplying the stored data to said control means.

21. An apparatus according to claim 19, further comprising:

means for storing frequency data of a reference channel among channels to be selected and the frequency difference of the reference channel and the remaining channels, and supplying the stored data to said control means.

22. An apparatus according to claim 19, wherein said counting means satisfies the following condition:

a maximum operation frequency of said counting means $\geq (fmax/$ division ration$)$.

23. An apparatus according to claim 19, wherein said counting means satisfies the following condition:

$$2^Y \geq (fmax-fmin)/fres,$$

wherein (fmax–fmin) represents a control range of a local oscillation frequency, fres represents a member of control steps for said digital/analog conversion means, and Y represents a bit number of said counting means.

24. An apparatus according to claim 19, wherein said apparatus satisfies the following condition:

$$Tmin=[\text{division ration}/fmax] \times [(fmax-fmin)/fres],$$

wherein Tmin represents a minimum time value during which said control means reads the output value from said counting means, the division ratio representing a division ratio used in said dividing means, fmax and fmin represents maximum and minimum local oscillation frequencies, respectively, and fres represents a number of control steps used in said digital/analog conversion means.

* * * * *